United States Patent
Kim et al.

(10) Patent No.: US 10,796,740 B2
(45) Date of Patent: Oct. 6, 2020

(54) METHOD FOR GENERATING COMMAND PULSES AND SEMICONDUCTOR DEVICE CONFIGURED TO PERFORM THE METHOD

(71) Applicant: SK hynix Inc., Icheon-si Gyeonggi-do (KR)

(72) Inventors: Chang Hyun Kim, Seoul (KR); Jae Il Kim, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/424,207

(22) Filed: May 28, 2019

(65) Prior Publication Data

US 2020/0160899 A1 May 21, 2020

(30) Foreign Application Priority Data

Nov. 19, 2018 (KR) .................. 10-2018-0142645

(51) Int. Cl.
*G11C 8/18* (2006.01)
*G11C 8/10* (2006.01)

(52) U.S. Cl.
CPC . *G11C 8/18* (2013.01); *G11C 8/10* (2013.01)

(58) Field of Classification Search
CPC .... G11C 8/18; G11C 8/10; G11C 7/22; G11C 7/109
See application file for complete search history.

(56) References Cited

U.S. PATENT DOCUMENTS

| 2010/0039877 A1* | 2/2010 | Lee | ........... G11C 16/10 365/230.08 |
| 2013/0223177 A1* | 8/2013 | Cho | ........... G11C 8/06 365/230.06 |
| 2018/0108396 A1 | 4/2018 | Matsuno et al. | |

FOREIGN PATENT DOCUMENTS

KR     1020180001278 A     1/2018

* cited by examiner

*Primary Examiner* — David Lam
(74) *Attorney, Agent, or Firm* — William Park & Associates Ltd.

(57) ABSTRACT

A semiconductor device includes a first command pulse generation circuit configured to generate a first command pulse from an internal command address based on a first blocking signal; and a second command pulse generation circuit configured to generate a second command pulse from the internal command address based on a second blocking signal.

21 Claims, 11 Drawing Sheets

METHOD FOR GENERATING COMMAND PULSES AND SEMICONDUCTOR DEVICE CONFIGURED TO PERFORM THE METHOD

CROSS-REFERENCE TO RELATED APPLICATION

The present application claims priority under 35 U.S.C. § 119(a) to Korean Patent Application No. 10-2018-0142645 filed on Nov. 19, 2018 in the Korean Intellectual Property Office, which is incorporated herein by reference in its entirety.

BACKGROUND

1. Technical Field

Embodiments of the present disclosure generally relate to a semiconductor device configure to generate command pulses.

2. Related Art

A semiconductor device performs various internal operations. The various internal operations include a write operation for storing data in memory cells and a read operation for outputting data that has been stored in the memory cells. In order to perform the various internal operations, the semiconductor device may generate a command pulse by decoding a command inputted from an outside.

SUMMARY

In an embodiment, a semiconductor device may include: a first command pulse generation circuit configured to generate a first command pulse from an internal command address based on a first blocking signal; and a second command pulse generation circuit configured to generate a second command pulse from the internal command address based on a second blocking signal. The first blocking signal or the second blocking signal is activated when the first command pulse and the second command pulse are generated from a command inputted during a period of at least N number of cycles of a clock. N may be an integer.

In an embodiment, a semiconductor device may include: a first blocking signal generation circuit configured to generate a second blocking signal based on a first latched command address and a first blocking signal; and a first command pulse generation circuit configured to generate a first command pulse from an internal command address based on the first blocking signal. The second blocking signal is activated when the first command pulse is generated from a command inputted during a period of at least N number of cycles of a clock. N may be set to a natural number equal to or greater than 2.

In an embodiment, a method for generating command pulses may include: generating a second blocking signal which is activated, when a first command pulse is generated from a command inputted during a period of at least N number of cycles of a clock; and blocking an operation of generating a second command pulse, based on the second blocking signal. N may be set to a natural number equal to or greater than 2.

In an embodiment, a semiconductor device may include: a first command pulse generation circuit configured to generate a first command pulse from an internal command address, in synchronization with a first internal clock, based on a first blocking signal; and a second command pulse generation circuit configured to generate a second command pulse from the internal command address, in synchronization with a second internal clock, based on a second blocking signal. The first blocking signal may be activated and the second blocking signal may be deactivated when the first command pulse and the second command pulse are generated from a command inputted during a period of at least N number of cycles of a clock. N may be an integer.

DETAILED DESCRIPTION

Hereinafter, a method for generating command pulses and a semiconductor device for performing the same will be described below with reference to the accompanying drawings through various examples of embodiments.

Various embodiments may be directed to a semiconductor device capable of generating command pulses.

According to various embodiments, by blocking the generation of an unintended command pulse in generating a command pulse based on a command inputted during a period of at least two cycles of a clock, it may be possible to stably generate a command pulse for an internal operation.

According to various embodiments, by unblocking the generation of a command pulse at an appropriate time when successively generating command pulses, it may be possible to prevent the generation of a command pulse from being unintentionally blocked.

Figure 1:
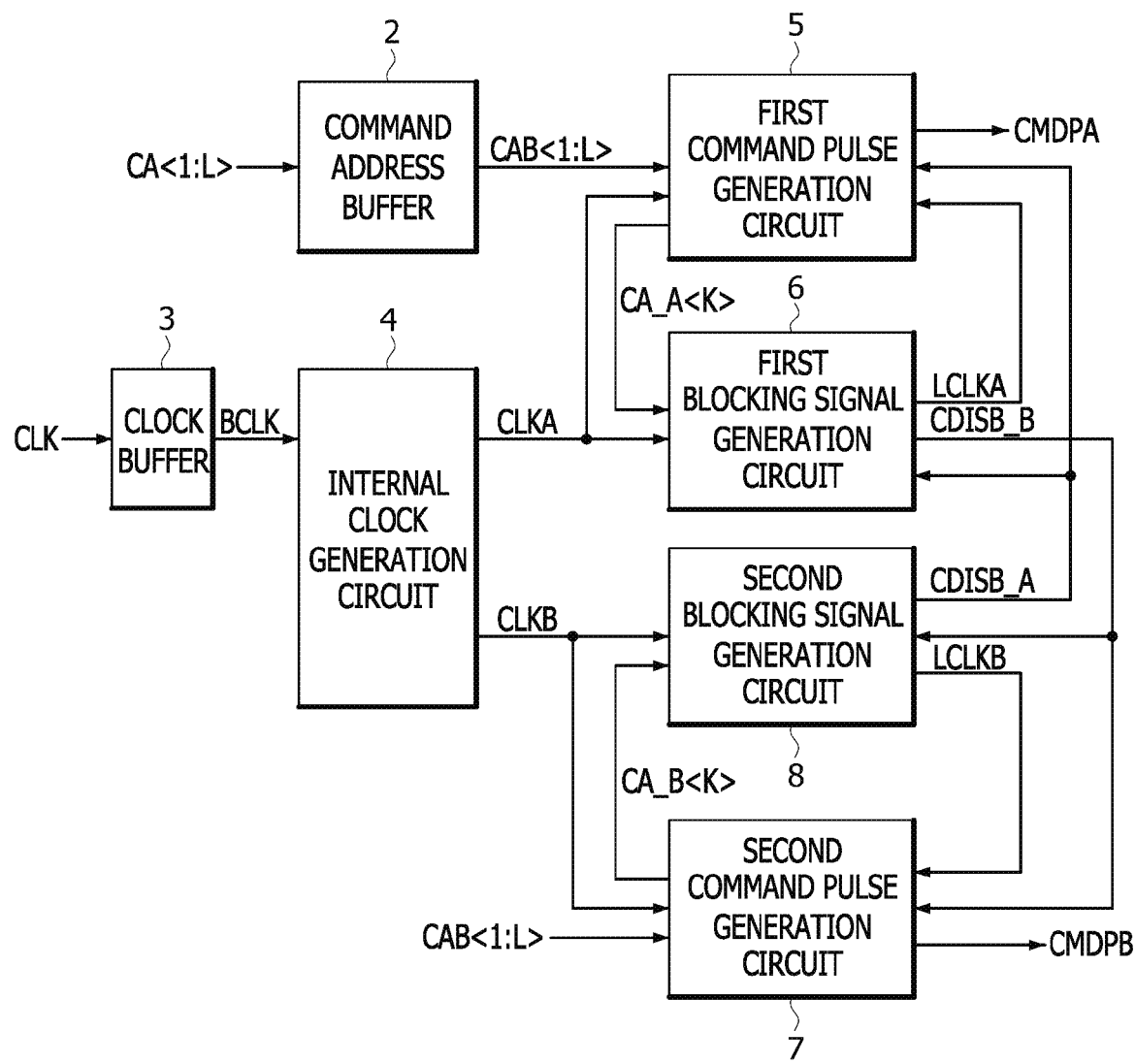
FIG. 1 is a block diagram illustrating a representation of an example of the configuration of a semiconductor device in accordance with an embodiment.

As illustrated in FIG. 1, a semiconductor device 1 in accordance with an embodiment may include a command address buffer 2, a clock buffer 3, an internal clock generation circuit 4, a first command pulse generation circuit 5, a first blocking signal generation circuit 6, a second command pulse generation circuit 7 and a second blocking signal generation circuit 8.

The command address buffer 2 may buffer a command address CA<1:L> and thereby generate an internal command address CAB<1:L>. The command address CA<1:L> may include a command and an address for performing various internal operations. The internal operations may include a write operation, a read operation, a refresh operation, a mode register write operation, a mode register read operation, a mask write operation, and so forth. The number L of bits included in the command address CA<1:L> and the internal command address CAB<1:L> may be set variously depending on an embodiment.

The internal clock generation circuit 4 may receive a buffered clock BCLK which is generated as a clock CLK is buffered through a clock buffer 3, and may generate a first internal clock CLKA and a second internal clock CLKB. The internal clock generation circuit 4 may divide the buffered clock BCLK and thereby generate the first internal clock CLKA and the second internal clock CLKB. The cycle of the first internal clock CLKA and the second internal clock CLKB may be set to be N times longer than the cycle of the clock CLK and the buffered clock BCLK. N may be set to a natural number greater than 2.

The first command pulse generation circuit 5 may generate a first latched command address CA_A<K> and a first command pulse CMDPA from the internal command address CAB<1:L> based on the first internal clock CLKA, a first blocking signal CDISB_A and a first latched clock LCLKA. The first command pulse generation circuit 5 may latch the internal command address CAB<1:L> in synchronization with the first internal clock CLKA and thereby generate the first latched command address CA_A<K>. In the case where the first command pulse CMDPA is generated from a command inputted during a period of two cycles of the clock CLK, the first latched command address CA_A<K> may be generated at a first logic level. In the case where the first command pulse CMDPA is generated from a command inputted during a period of one cycle of the clock CLK, the first latched command address CA_A<K> may be generated at a second logic level. The first command pulse generation circuit 5 may latch the internal command address CAB<1:L> in synchronization with the first internal clock CLKA and generate the first command pulse CMDPA from the latched internal command address CAB<1:L>. In a state in which the first blocking signal CDISB_A is deactivated, the first command pulse generation circuit 5 may decode a first latched command address CA_A<1:L>, latch the decoded first latched command address CA_A<1:L> in synchronization with the first latched clock LCLKA, and thereby generate the first command pulse CMDPA. In a state in which the first blocking signal CDISB_A is activated, the first command pulse generation circuit 5 may block the generation of the first command pulse CMDPA from the first latched command address CA_A<1:L>. In the present embodiment, a logic level at which the first blocking signal CDISB_A is activated may be set to a logic low level, but may be set to a logic high level depending on an embodiment. In the present embodiment, the first logic level may be set to a logic low level, and the second logic level may be set to a logic high level. A configuration and operation of the first command pulse generation circuit 5 will be described later with reference to FIG. 2.

The first blocking signal generation circuit 6 may generate a second blocking signal CDISB_B and the first latched clock LCLKA based on the first latched command address CA_A<K>, the first blocking signal CDISB_A and the first internal clock CLKA. The first blocking signal generation circuit 6 may generate the second blocking signal CDISB_B which is activated, in the case where the first latched command address CA_A<K> is inputted at the first logic level in a state in which the first blocking signal CDISB_A is deactivated. The first blocking signal generation circuit 6 may generate the second blocking signal CDISB_B which is deactivated, in the case where the first blocking signal CDISB_A is activated or the first latched command address CA_A<K> is inputted at the second logic level. The first blocking signal generation circuit 6 may delay the first internal clock CLKA and thereby generate the first latched clock LCLKA. A period during which the first internal clock CLKA is delayed to generate the first latched clock LCLKA may be set differently depending on an embodiment. A configuration and operation of the first blocking signal generation circuit 6 will be described later with reference to FIG. 3.

The second command pulse generation circuit 7 may generate a second latched command address CA_B<K> and a second command pulse CMDPB from the internal command address CAB<1:L> based on the second internal clock CLKB, the second blocking signal CDISB_B and a second latched clock LCLKB. The second command pulse generation circuit 7 may latch the internal command address CAB<1:L> in synchronization with the second internal clock CLKB and thereby generate the second latched command address CA_B<K>. In the case where the second command pulse CMDPB is generated from a command inputted during a period of two cycles of the clock CLK, the second latched command address CA_B<K> may be generated at the first logic level. In the case where the second command pulse CMDPB is generated from a command inputted during a period of one cycle of the clock CLK, the second latched command address CA_B<K> may be generated at the second logic level. The second command pulse generation circuit 7 may latch the internal command address CAB<1:L> in synchronization with the second internal clock CLKB and generate the second command pulse CMDPB from the latched internal command address CAB<1:L>. In a state in which the second blocking signal CDISB_B is deactivated, the second command pulse generation circuit 7 may decode a second latched command address CA_B<1:L>, latch the decoded second latched command address CA_B<1:L> in synchronization with the second latched clock LCLKB, and thereby generate the second command pulse CMDPB. In a state in which the second blocking signal CDISB_B is activated, the second command pulse generation circuit 7 may block the generation of the second command pulse CMDPB from the second latched command address CA_B<1:L>. In the present embodiment, a logic level at which the second blocking signal CDISB_B is activated may be set to a logic low level, but may be set to a logic high level depending on an embodiment. A configuration and operation of the second command pulse generation circuit 7 will be described later with reference to FIG. 4.

The second blocking signal generation circuit 8 may generate the first blocking signal CDISB_A and the second latched clock LCLKB based on the second latched command address CA_B<K>, the second blocking signal CDISB_B and the second internal clock CLKB. The second blocking signal generation circuit 8 may generate the first blocking signal CDISB_A which is activated, in the case where the second latched command address CA_B<K> is inputted at the first logic level in a state in which the second blocking signal CDISB_B is deactivated. The second blocking signal generation circuit 8 may generate the first blocking signal CDISB_A which is deactivated, in the case where the second blocking signal CDISB_B is activated or the second latched command address CA_B<K> is inputted at the second logic level. The second blocking signal generation circuit 8 may delay the second internal clock CLKB and thereby generate the second latched clock LCLKB. A period during which the second internal clock CLKB is delayed to generate the second latched clock LCLKB may be set differently depending on an embodiment. A configuration and operation of the second blocking signal generation circuit 8 will be described later with reference to FIG. 5.

Figure 2:
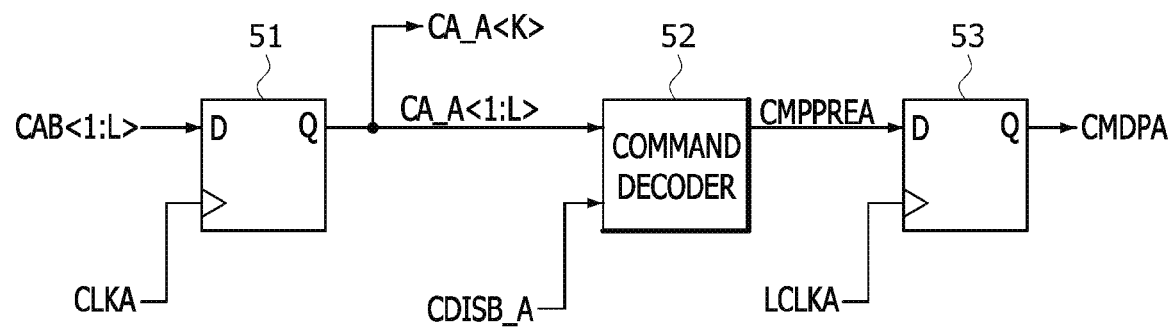
FIG. 2 is a diagram illustrating a representation of an example of the first command pulse generation circuit included in the semiconductor device shown in FIG. 1.

Referring to FIG. 2, the first command pulse generation circuit 5 may include a latched command address generation circuit 51, a command decoder 52 and a command pulse output circuit 53.

The latched command address generation circuit 51 may latch the internal command address CAB<1:L> in synchronization with the first internal clock CLKA and output the latched internal command address CAB<1:L> as the first latched command address CA_A<1:L>. The latched command address generation circuit 51 may latch the internal command address CAB<1:L> at a time when the first internal clock CLKA transitions from a logic low level to a logic high level (hereinafter, referred to as a 'rising edge'). The latched command address generation circuit 51 may be realized by a D flip-flop. One bit CA_A<K> of the first latched command address CA_A<1:L> may be used in generating the second blocking signal CDISB_B.

The command decoder 52 may generate a first pre-command pulse CMPPREA from the first latched command address CA_A<1:L> based on the first blocking signal CDISB_A. The command decoder 52 may generate the first pre-command pulse CMPPREA by decoding the first latched command address CA_A<1:L> in a state in which the first blocking signal CDISB_A is deactivated. The command decoder 52 may block the operation of generating the first pre-command pulse CMPPREA from the first latched command address CA_A<1:L> in a state in which the first blocking signal CDISB_A is activated.

The command pulse output circuit 53 may latch the first pre-command pulse CMPPREA in synchronization with the first latched clock LCLKA and output the latched first pre-command pulse CMPPREA as the first command pulse CMDPA. The command pulse output circuit 53 may latch the first pre-command pulse CMPPREA at the rising edge of the first latched clock LCLKA. The command pulse output circuit 53 may be realized by a D flip-flop.

Figure 3:
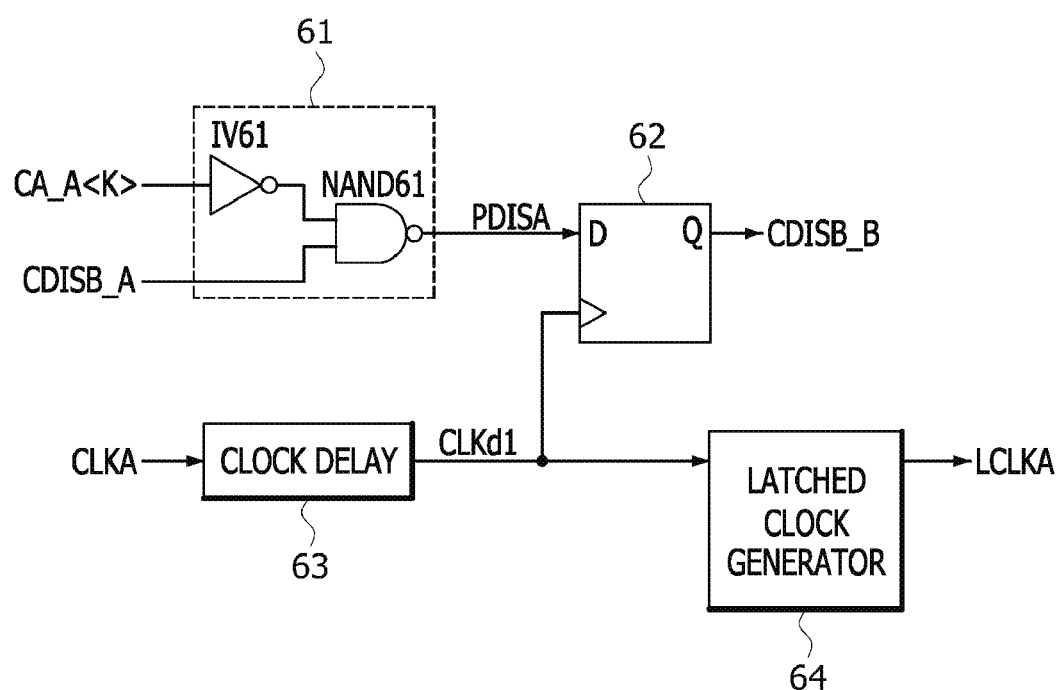
FIG. 3 is a diagram illustrating a representation of an example of the first blocking signal generation circuit included in the semiconductor device shown in FIG. 1.

Referring to FIG. 3, the first blocking signal generation circuit 6 may include a pre-blocking signal generation circuit 61, a blocking signal output circuit 62, a clock delay 63 and a latched clock generator 64.

The pre-blocking signal generation circuit 61 may perform inversion and NAND logic operations. For example, the pre-blocking signal generation circuit 61 may include an inverter IV61 and a NAND gate NAND61. The inverter IV61 may invert and buffer the first latched command address CA_A<K> and thereby output an output signal. The NAND gate NAND61 may receive the output signal of the inverter IV61 and the first blocking signal CDISB_A, perform a NAND logic operation and thereby generate a first pre-blocking signal PDISA. The pre-blocking signal generation circuit 61 may generate the first pre-blocking signal PDISA which is activated to a logic low level, in the case where the first latched command address CA_A<K> is inputted at the logic low level in a state in which the first blocking signal CDISB_A is deactivated to the logic high level.

The blocking signal output circuit 62 may latch the first pre-blocking signal PDISA in synchronization with a first delayed clock CLKd1 and output the latched first pre-blocking signal PDISA as the second blocking signal CDISB_B. The blocking signal output circuit 62 may latch the first pre-blocking signal PDISA at the rising edge of the first delayed clock CLKd1. The blocking signal output circuit 62 may be realized by a D flip-flop.

The clock delay 63 may delay the first internal clock CLKA and thereby generate the first delayed clock CLKd1. A period during which the first internal clock CLKA is delayed to generate the first delayed clock CLKd1 may be set differently depending on an embodiment. The latched clock generator 64 may delay the first delayed clock CLKd1 and thereby generate the first latched clock LCLKA. A period during which the first delayed clock CLKd1 is delayed to generate the first latched clock LCLKA may be set differently depending on an embodiment.

Figure 4:
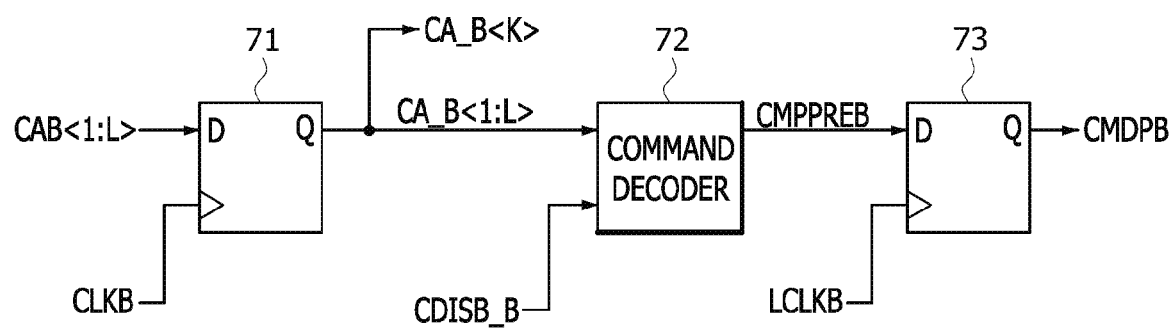
FIG. 4 is a diagram illustrating a representation of an example of the second command pulse generation circuit included in the semiconductor device shown in FIG. 1.

Referring to FIG. 4, the second command pulse generation circuit 7 may include a latched command address generation circuit 71, a command decoder 72 and a command pulse output circuit 73.

The latched command address generation circuit 71 may latch the internal command address CAB<1:L> in synchronization with the second internal clock CLKB and output the latched internal command address CAB<1:L> as the second latched command address CA_B<1:L>. The latched command address generation circuit 71 may latch the internal command address CAB<1:L> at the rising edge of the second internal clock CLKB. The latched command address generation circuit 71 may be realized by a D flip-flop. One bit CA_B<K> of the second latched command address CA_B<1:L> may be used in generating the first blocking signal CDISB_A.

The command decoder 72 may generate a second pre-command pulse CMPPREB from the second latched command address CA_B<1:L> based on the second blocking signal CDISB_B. The command decoder 72 may generate the second pre-command pulse CMPPREB by decoding the second latched command address CA_B<1:L> in a state in which the second blocking signal CDISB_B is deactivated. The command decoder 72 may block the operation of generating the second pre-command pulse CMPPREB from the second latched command address CA_B<1:L> in a state in which the second blocking signal CDISB_B is activated.

The command pulse output circuit 73 may latch the second pre-command pulse CMPPREB in synchronization with the second latched clock LCLKB and output the latched second pre-command pulse CMPPREB as the second command pulse CMDPB. The command pulse output circuit 73 may latch the second pre-command pulse CMPPREB at the rising edge of the second latched clock LCLKB. The command pulse output circuit 73 may be realized by a D flip-flop.

Figure 5:
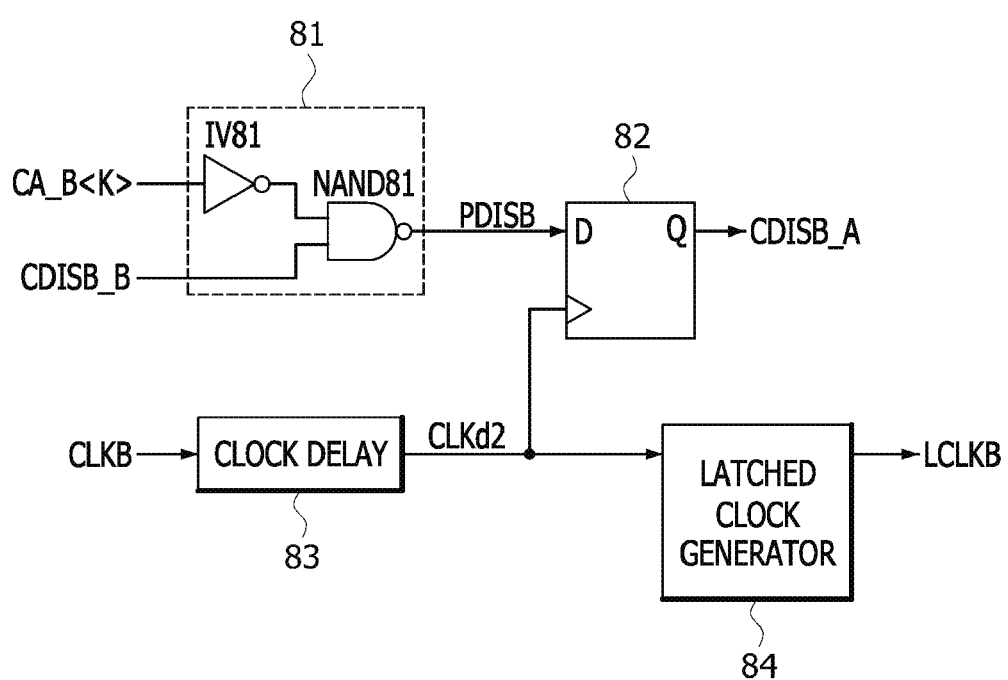
FIG. 5 is a diagram illustrating a representation of an example of the second blocking signal generation circuit included in the semiconductor device shown in FIG. 1.
Figure 6:
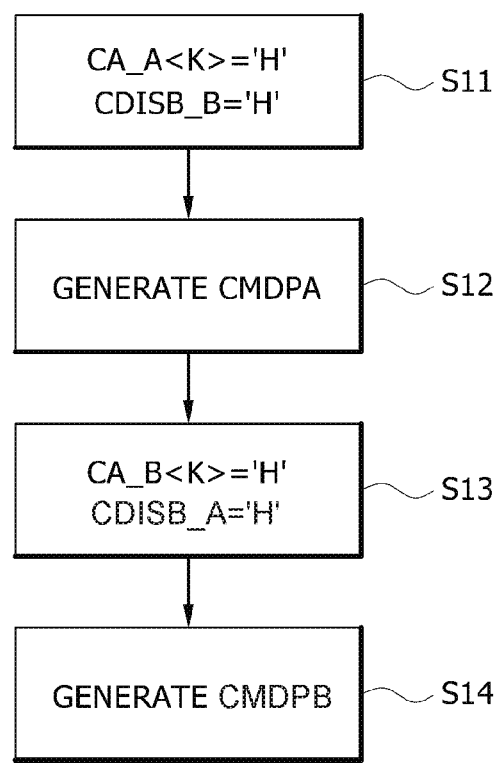
FIGS. 6 to 10 are representations of examples of diagrams to assist in the explanation of the operation of the semiconductor device shown in FIG. 1.
Figure 7:
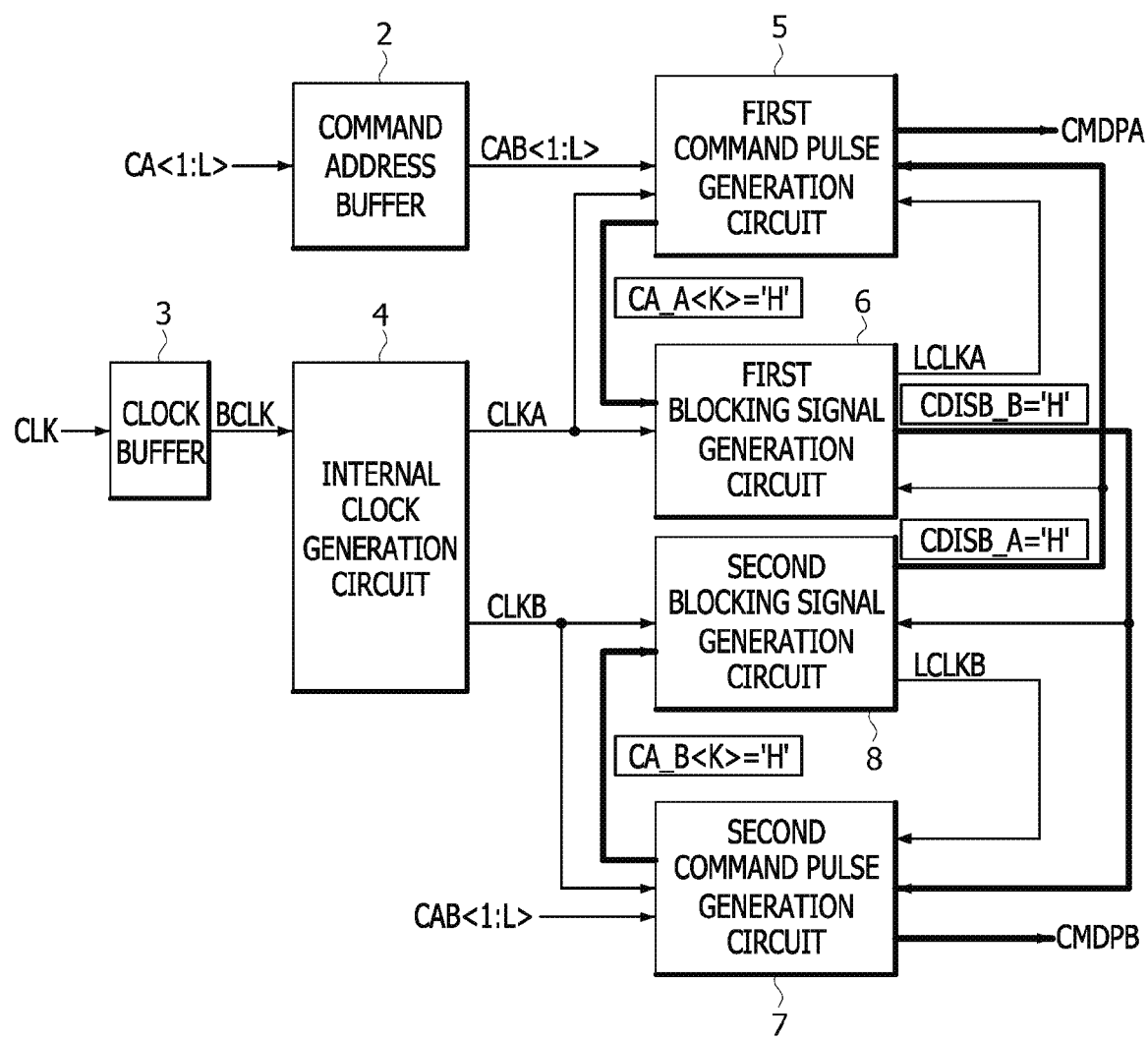
Figure 8:
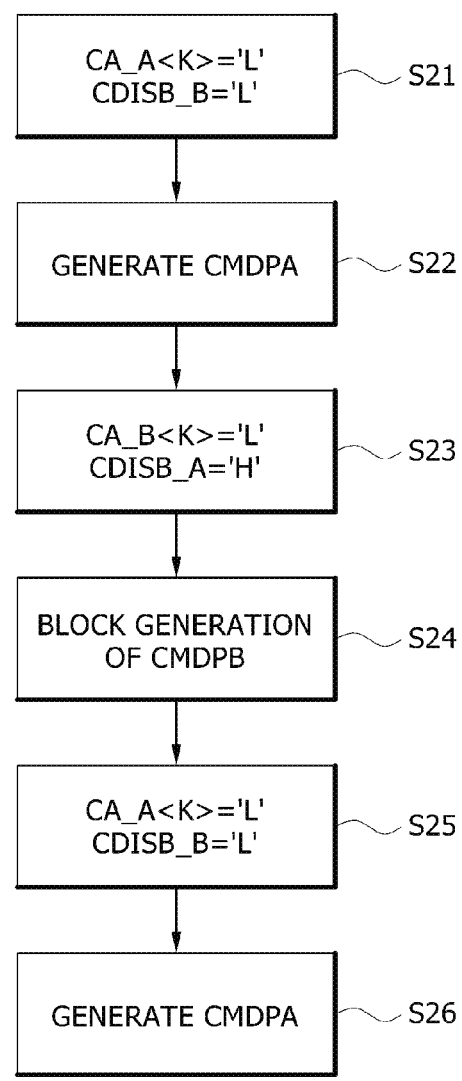
Figure 9:
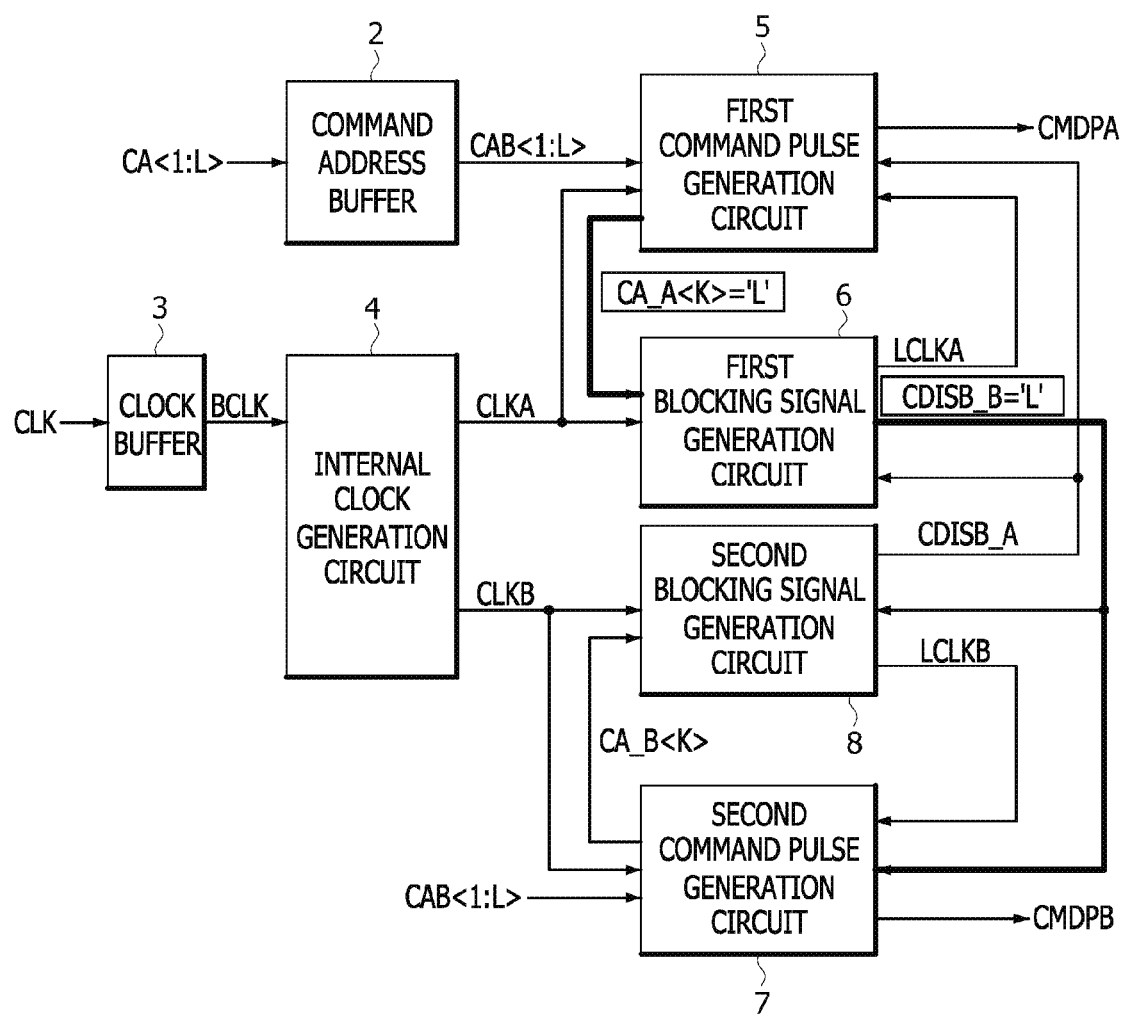
Figure 10:
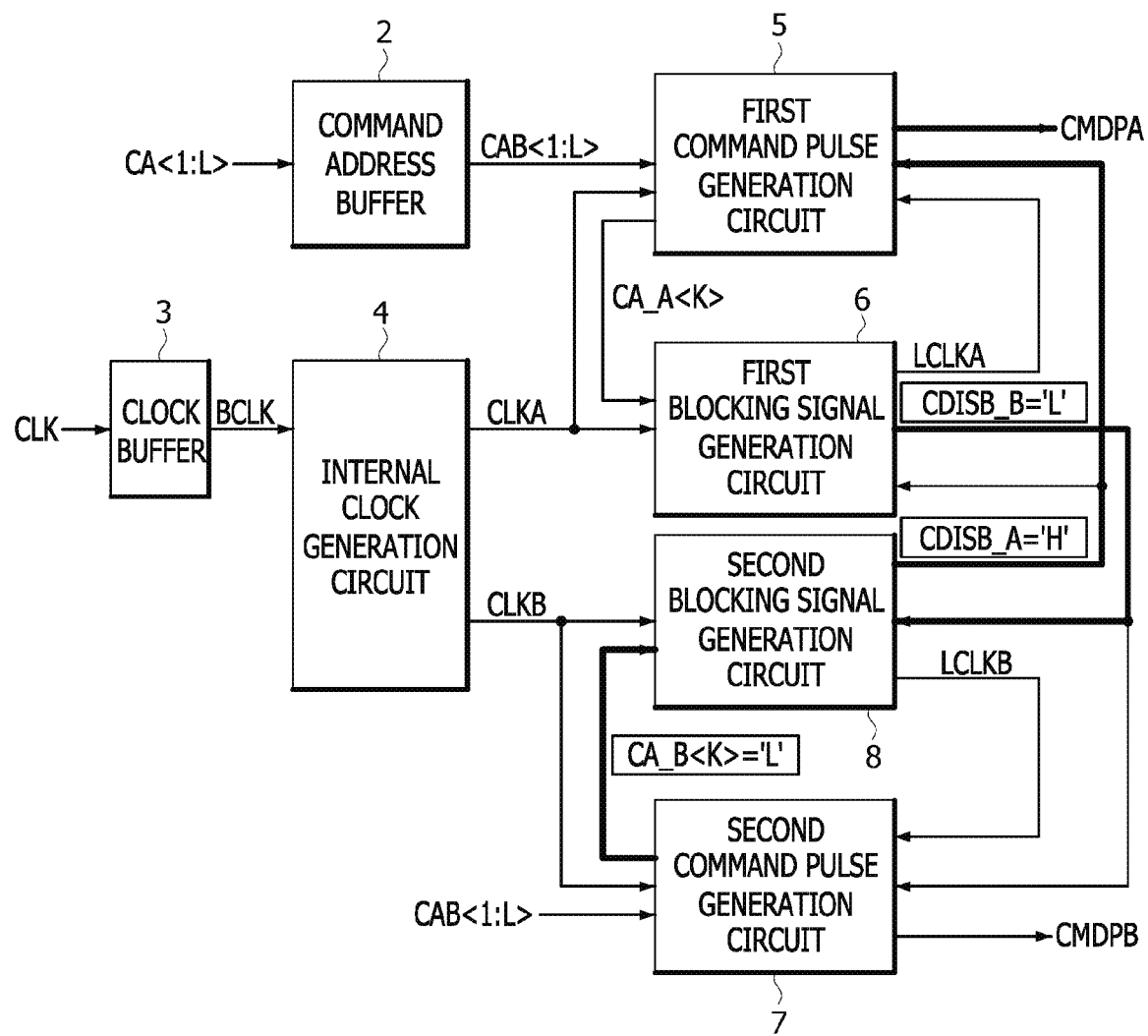

Referring to FIG. 5, the second blocking signal generation circuit 8 may include a pre-blocking signal generation circuit 81, a blocking signal output circuit 82, a clock delay 83 and a latched clock generator 84.

The pre-blocking signal generation circuit 81 may perform inversion and NAND logic operations. For example, the pre-blocking signal generation circuit 81 may include an inverter IV81 and a NAND gate NAND81. The inverter IV81 may invert and buffer the second latched command address CA_B<K> and thereby output an output signal. The NAND gate NAND81 may receive the output signal of the inverter IV81 and the second blocking signal CDISB_B, perform a NAND logic operation and thereby generate a second pre-blocking signal PDISB. The pre-blocking signal generation circuit 81 may generate the second pre-blocking signal PDISB which is activated to a logic low level, in the case where the second latched command address CA_B<K> is inputted at the logic low level in a state in which the second blocking signal CDISB_B is deactivated to the logic high level.

The blocking signal output circuit 82 may latch the second pre-blocking signal PDISB in synchronization with a second delayed clock CLKd2 and output the latched second pre-blocking signal PDISB as the first blocking signal CDISB_A. The blocking signal output circuit 82 may latch the second pre-blocking signal PDISB at the rising edge of the second delayed clock CLKd2. The blocking signal output circuit 82 may be realized by a D flip-flop.

The clock delay 83 may delay the second internal clock CLKB and thereby generate the second delayed clock CLKd2. A period during which the second internal clock CLKB is delayed to generate the second delayed clock CLKd2 may be set differently depending on an embodiment. The latched clock generator 84 may delay the second delayed clock CLKd2 and thereby generate the second latched clock LCLKB. A period during which the second delayed clock CLKd2 is delayed to generate the second latched clock LCLKB may be set differently depending on an embodiment.

The operation of the semiconductor device 1 configured as mentioned above will be described below with reference to FIGS. 6 to 10, by being divided into an operation of generating command pulses based on a command inputted during one cycle of the clock CLK and an operation of generating command pulses based on a command inputted during two cycles of the clock CLK.

First, the operation of generating command pulses based on a command inputted during one cycle of the clock CLK will be described.

In the case where the first latched command address CA_A<K> which is generated as the internal command address CAB<1:L> is latched in synchronization with the rising edge of the first internal clock CLKA is set to the logic high level 'H,' the first blocking signal generation circuit 6 generates the second blocking signal CDISB_B which is deactivated to the logic high level 'H' (S11). The first command pulse generation circuit 5 receives the first blocking signal CDISB_A which is deactivated to the logic high level 'H,' decodes the internal command address CAB<1:L> and thereby generates the first command pulse CMDPA (S12).

In the case where the second latched command address CA_B<K> which is generated as the internal command address CAB<1:L> is latched in synchronization with the rising edge of the second internal clock CLKB is set to the logic high level 'H,' the second blocking signal generation circuit 8 generates the first blocking signal CDISB_A which is deactivated to the logic high level 'H' (S13). The second command pulse generation circuit 7 receives the second blocking signal CDISB_B which is deactivated to the logic high level 'H,' decodes the internal command address CAB<1:L> and thereby generates the second command pulse CMDPB (S14).

As is apparent from the above descriptions, in the case of generating the first command pulse CMDPA and the second command pulse CMDPB from a command inputted during one cycle of the clock CLK, the semiconductor device 1 in accordance with an embodiment of the present disclosure does not block the generation of the first command pulse CMDPA and the second command pulse CMDPB by setting the first blocking signal CDISB_A and the second blocking signal CDISB_B to the deactivated states.

Hereafter, the operation of generating command pulses based on a command inputted during two cycles of the clock CLK will be described.

In the case where the first latched command address CA_A<K> which is generated as the internal command address CAB<1:L> is latched in synchronization with the rising edge of the first internal clock CLKA is set to the logic low level 'L,' the first blocking signal generation circuit 6 generates the second blocking signal CDISB_B which is activated to the logic low level 'L' (S21). The first command pulse generation circuit 5 receives the first blocking signal CDISB_A which is deactivated to the logic high level 'H,' decodes the internal command address CAB<1:L> and thereby generates the first command pulse CMDPA (S22).

In the case where the second latched command address CA_B<K> which is generated as the internal command address CAB<1:L> is latched in synchronization with the rising edge of the second internal clock CLKB is set to the logic low level 'L,' the second blocking signal generation circuit 8 generates the first blocking signal CDISB_A which is deactivated to the logic high level 'H' by the second blocking signal CDISB_B activated to the logic low level 'L' (S23). The second command pulse generation circuit 7 receives the second blocking signal CDISB_B which is activated to the logic low level 'L,' decodes the internal command address CAB<1:L> and thereby blocks the operation of generating the second command pulse CMDPB (S24).

In the case where the first latched command address CA_A<K> which is generated as the internal command address CAB<1:L> is latched in synchronization with the rising edge of the first internal clock CLKA is set to the logic low level 'L,' the first blocking signal generation circuit 6 generates the second blocking signal CDISB_B which is activated to the logic low level 'L' (S25). The first command pulse generation circuit 5 receives the first blocking signal CDISB_A which is deactivated to the logic high level 'H,' decodes the internal command address CAB<1:L> and thereby generates the first command pulse CMDPA (S26).

As is apparent from the above descriptions, in the case of generating the first command pulse CMDPA from a command inputted during two cycles of the clock CLK, the semiconductor device 1 in accordance with an embodiment of the present disclosure may prevent the second command pulse CMDPB from being unnecessarily generated, by blocking the generation of the second command pulse CMDPB by setting the second blocking signal CDISB_B to the activated state. In the case of generating the first command pulse CMDPA after blocking the generation of the second command pulse CMDPB, it is possible to prevent the generation of the first command pulse CMDPA from being blocked, by setting the first blocking signal CDISB_A to the deactivated state by the second blocking signal CDISB_B of the activated state.

Figure 11:
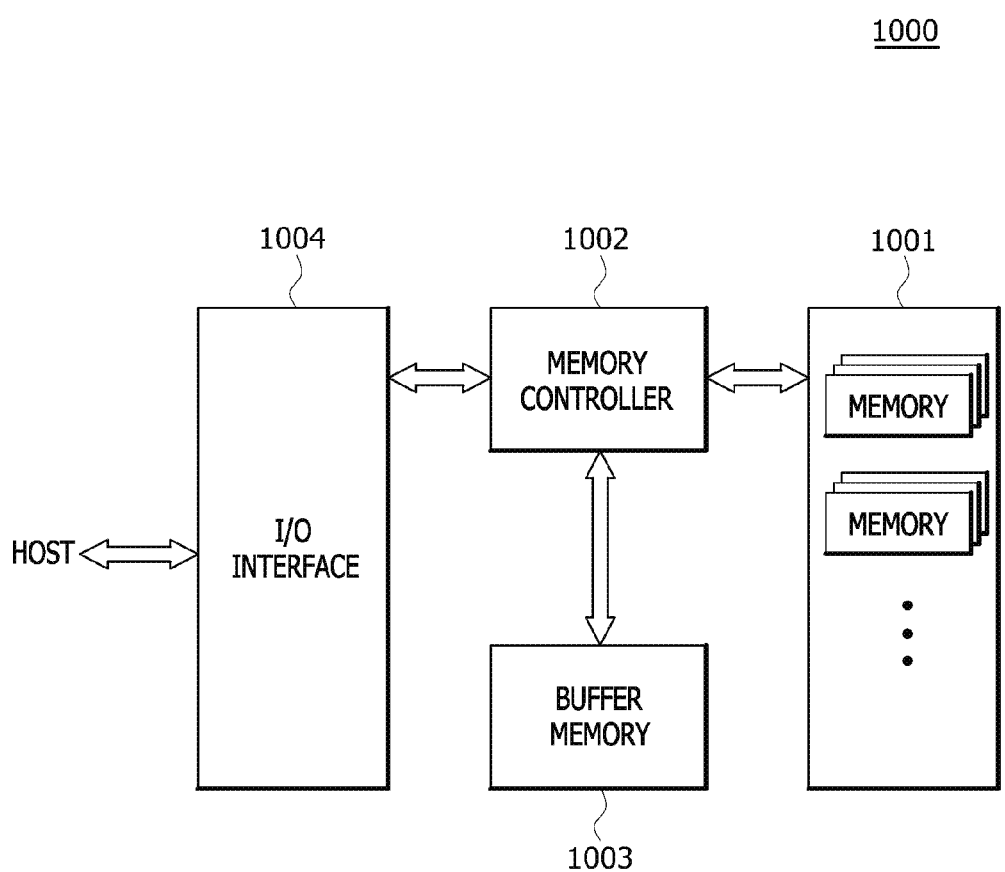
FIG. 11 is a diagram illustrating a representation of an example of the configuration of an electronic system to which the semiconductor device shown in FIG. 1 is applied.

The semiconductor device 1 described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output (input and output) interface 1004.

The data storage 1001 stores data applied from the memory controller 1002, and reads out stored data and outputs the read-out data to the memory controller 1002, according to control signals from the memory controller 1002. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM), etc.

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory). The buffer memory 1003 may include the semiconductor devices illustrated and discussed with respect to FIG. 1.

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDHC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the method for generating command pulses and the semiconductor device for performing the same described herein should not be limited based on the described embodiments.

What is claimed is:

1. A semiconductor device comprising:
a first command pulse generation circuit configured to generate a first command pulse from an internal command address based on a first blocking signal; and
a second command pulse generation circuit configured to generate a second command pulse from the internal command address based on a second blocking signal;
a first blocking signal generation circuit configured to generate the second blocking signal based on a first latched command address and the first blocking signal that is outputted from a second blocking signal generation circuit,
wherein the first blocking signal or the second blocking signal is activated when the first command pulse and the second command pulse are generated from a command inputted during a period of at least N number of cycles of a clock, and
wherein N is an integer.

2. The semiconductor device according to claim 1, wherein the first blocking signal and the second blocking signal are deactivated when the first command pulse and the second command pulse are generated from a command inputted during a period of one cycle of the clock.

3. The semiconductor device according to claim 1, wherein the second blocking signal is activated and generation of the second command pulse is blocked when the first command pulse is generated from the command inputted during the period of at least N number of cycles of the clock, and N is set to a natural number equal to or greater than 2.

4. The semiconductor device according to claim 1, wherein the first blocking signal is activated and generation of the first command pulse is blocked when the second command pulse is generated from the command inputted during the period of at least N number of cycles of the clock.

5. The semiconductor device according to claim 1, wherein the first command pulse generation circuit comprises:
a command decoder configured to generate a pre-command pulse by decoding a first latched command address based on the first blocking signal; and
a command pulse output circuit configured to latch the pre-command pulse in synchronization with a first latched clock, and generate the latched pre-command pulse as the first command pulse.

6. The semiconductor device according to claim 5, wherein the first latched command address is generated by latching the internal command address in synchronization with a first internal clock.

7. The semiconductor device according to claim 6, wherein the first internal clock is generated by dividing the clock, and the first latched clock is generated by delaying the first internal clock.

8. The semiconductor device according to claim 1, wherein the first blocking signal generation circuit generates the second blocking signal which is activated, when the first latched command address is a preset logic level in a state in which the first blocking signal is deactivated.

9. The semiconductor device according to claim 1, wherein the first blocking signal generation circuit comprises:
a pre-blocking signal generation circuit configured to generate a first pre-blocking signal based on the first latched command address and the first blocking signal; and
a blocking signal output circuit configured to latch the first pre-blocking signal in synchronization with a first delayed clock generated by delaying the first internal clock, and output the latched first pre-blocking signal as the second blocking signal.

10. The semiconductor device according to claim 1, further comprising:
the second blocking signal generation circuit configured to generate the first blocking signal based on a second latched command address and the second blocking signal.

11. The semiconductor device according to claim 1, wherein only one of the first blocking signal or the second blocking signal is activated.

12. A semiconductor device comprising:
a first blocking signal generation circuit configured to generate a second blocking signal based on a first latched command address and a first blocking signal that is outputted from a second blocking signal generation circuit; and a first command pulse generation circuit configured to generate a first command pulse from an internal command address based on the first blocking signal, wherein the second blocking signal is activated when the first command pulse is generated from a command inputted during a period of at least N number of cycles of a clock, and wherein N is set to a natural number equal to or greater than 2.

13. The semiconductor device according to claim 12, wherein the first blocking signal generation circuit generates the second blocking signal which is activated, when the first latched command address is a preset logic level in a state in which the first blocking signal is deactivated.

14. The semiconductor device according to claim 12, wherein the first command pulse generation circuit comprises:
   a command decoder configured to generate a pre-command pulse by decoding a first latched command address based on the first blocking signal; and
   a command pulse output circuit configured to latch the pre-command pulse in synchronization with a first latched clock, and generate the latched pre-command pulse as the first command pulse.

15. The semiconductor device according to claim 12, further comprising:
   the second blocking signal generation circuit configured to generate the first blocking signal based on a second latched command address and the second blocking signal; and
   a second command pulse generation circuit configured to generate a second command pulse from the internal command address based on the second blocking signal.

16. The semiconductor device according to claim 15, wherein, when the second blocking signal is activated, generation of the second command pulse is blocked.

17. The semiconductor device according to claim 15, wherein, when the second command pulse is generated from a command inputted during a period of at least N number of cycles of the clock, the first blocking signal is activated to block generation of the first command pulse.

18. The semiconductor device according to claim 15, wherein the first blocking signal and the second blocking signal are deactivated when the first command pulse and the second command pulse are generated from a command inputted during a period of one cycle of the clock.

19. A method for generating command pulses, comprising:
   generating, by a first blocking signal generation circuit, a second blocking signal, which is activated when a first command pulse generation circuit generates a first command pulse from a command that is inputted during a period of at least N number of cycles of a clock; and
   blocking a second command pulse generation circuit from performing an operation that generates a second command pulse, based on the second blocking signal,
   wherein N is set to a natural number equal to or greater than 2, and
   wherein the first blocking signal generation circuit is configured to generate the second blocking signal based on a first latched command address and the first blocking signal that is outputted from a second blocking signal generation circuit.

20. The method according to claim 19, further comprising:
   generating a first blocking signal, which is deactivated based on the activated second blocking signal; and
   generating the first command pulse from the command based on the first blocking signal.

21. A semiconductor device comprising:
   a first command pulse generation circuit configured to generate a first command pulse from an internal command address, in synchronization with a first internal clock, based on a first blocking signal; and
   a second command pulse generation circuit configured to generate a second command pulse from the internal command address, in synchronization with a second internal clock, based on a second blocking signal;
   a first blocking signal generation circuit configured to generate the second blocking signal based on a first latched command address and the first blocking signal that is outputted from a second blocking signal generation circuit,
   wherein the first blocking signal is activated and the second blocking signal is deactivated when the first command pulse and the second command pulse are generated from a command inputted during a period of at least N number of cycles of a clock, and
   wherein N is an integer.

* * * * *